US006653907B2

United States Patent
Kobota

(10) Patent No.: US 6,653,907 B2
(45) Date of Patent: Nov. 25, 2003

(54) FREQUENCY-VARIABLE RC OSCILLATOR AND MICROCOMPUTER

(75) Inventor: Susumu Kobota, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/051,508

(22) Filed: Jan. 17, 2002

(65) Prior Publication Data

US 2002/0097101 A1 Jul. 25, 2002

(30) Foreign Application Priority Data

Jan. 17, 2001 (JP) .................................... 2001-009363

(51) Int. Cl.[7] ............................................. H03K 3/26
(52) U.S. Cl. ................................... 331/111; 331/143
(58) Field of Search ..................... 331/111, 143, 331/150, 179

(56) References Cited

U.S. PATENT DOCUMENTS 5,702,426 A * 12/1997 Pons et al. ................. 607/27

FOREIGN PATENT DOCUMENTS

| EP | 0022060 | * 5/1980 | .................. 331/111 |
| JP | 1-114728 | * 5/1989 | .................. 331/111 |
| JP | 2001-285056 | * 10/2001 | .................. 331/111 |

* cited by examiner

Primary Examiner—Henry Choe
(74) Attorney, Agent, or Firm—Fish & Richardson P.C.

(57) ABSTRACT

Provided are a first RC oscillator (10) including a resistance and capacitor, a counter (20) for counting the number of source oscillation clocks from the first RC oscillator (10), a frequency setting register (30) for setting the number of source oscillation clocks in accordance with a desired oscillation frequency, and a comparator for comparing between a count value of the counter (20) and a set value of the frequency setting register (30). A clock is outputted depending upon a result of comparison by the comparator.

12 Claims, 3 Drawing Sheets

FREQUENCY-VARIABLE RC OSCILLATOR AND MICROCOMPUTER

BACKGROUND OF THE INVENTION

1. Field of the Invention

The present invention relates to a frequency-variable RC oscillator having an oscillation frequency to be set programmable and a microcomputer incorporating the same.

2. Description of the Related Art

In the microcomputer, accurate operating clock is required in order to positively implement various operations depending upon the application thereof. For this reason, it is a practice for such a microcomputer to utilize external oscillation, such as of a ceramic filter or quartz oscillator, to generate a correct operating clock for operation on the basis thereof.

At and around powered on timing, external oscillation is not stabilized. For this reason, an RC oscillator is incorporated to supply an operating clock until the external oscillation is stabilized.

However, the RC oscillator incorporated in the microcomputer largely varies in oscillation frequency due to variation in manufacture or change in temperature or power voltage. Accordingly, where an RC oscillator is used as a clock supply source in executing the main process of a microcomputer, there is a need for development of such software as to absorb such frequency variation.

SUMMARY OF THE INVENTION

It is an object of the present invention to make the oscillation frequency of an RC oscillator set programmable there by compensating for frequency variation caused due to variation in manufacture or the like and supplying a correct operating clock.

Meanwhile, another object of the invention is to incorporate an RC oscillator variable in oscillation frequency in a microcomputer and utilized as a clock supply source in executing the main process of the microcomputer, thereby facilitating the development of software and reducing the circuit parts for external oscillation and hence cost.

A frequency-variable RC oscillator of the present invention comprises: an RC oscillator including a resistance and capacitor; a counter for counting the number of source oscillation clocks from the RC oscillator; a frequency setting register for setting the number of source oscillation clocks corresponding to a desired oscillation frequency; and a comparator for comparing between a count value of the counter and a set value of the frequency setting register; whereby a clock is outputted depending upon a result of comparison by the comparator.

According to the above configuration, the oscillation frequency of an output clock can be set based on a step of a period of source oscillation supplied by the RC oscillator in accordance with a set value of the frequency setting register. Namely, according to this circuit, by increasing the source oscillation frequency and a prepared bit length of the frequency setting register, oscillation frequency can be set with higher accuracy thereby compensating for the frequency variation due to variation in manufacture or the like. Thus, correct operating clock can be provided.

Meanwhile, a microcomputer of the present invention is a microcomputer for generating a system clock in order for self-operation by incorporating a frequency-variable RC oscillator configured as above, comprising: a counter for counting the number of source oscillation clocks from the RC oscillator; a frequency setting register for setting the number of source oscillation clocks in accordance with a desired oscillation frequency; a comparator for comparing between a count value of the counter and a set value of the frequency setting register; and a clock generator for generating a system clock on the basis of a clock outputted depending on a result of comparison by said comparator.

According to the microcomputer configured as above, an inexpensive RC oscillation circuit can be utilized as a clock supply source in executing the main process. Accordingly, it is possible to facilitate software development and reduce the circuit parts for external oscillation and hence the cost.

DESCRIPTION OF THE PREFERRED EMBODIMENTS

Figure 1:
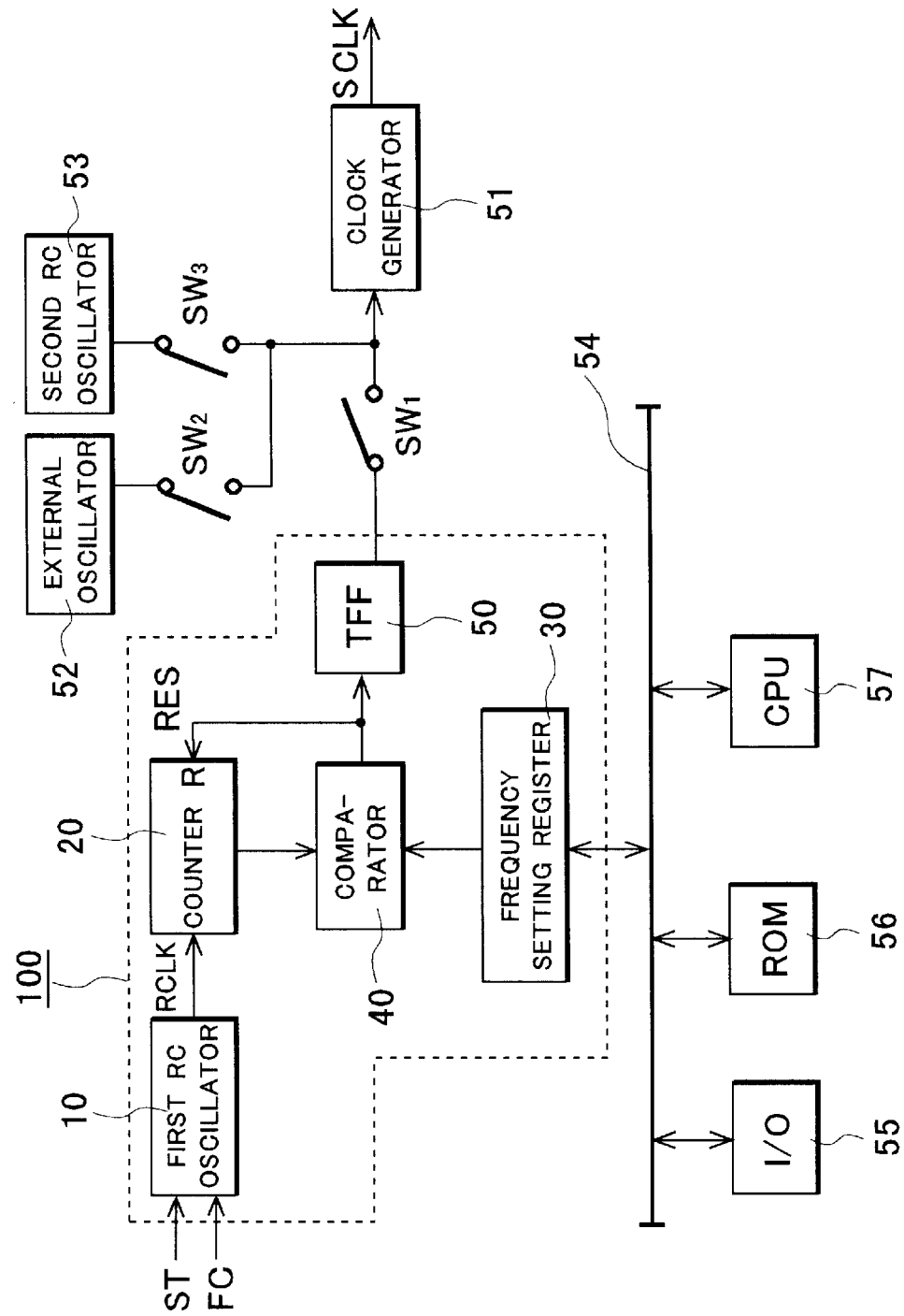
FIG. 1 shows a circuit block diagram of a frequency-variable RC oscillating circuit according to an embodiment of the present invention and a microcomputer incorporating the same.

The embodiment of the present invention will now be explained with referring to the drawings. FIG. 1 is a circuit block diagram of a frequency-variable RC oscillating circuit (100) of the invention and microcomputer incorporating the same. Meanwhile, FIG. 2 is a circuit diagram of a first RC oscillator (10) in FIG. 1.

The first RC oscillator (10) supplies a source-oscillation clock RCLK. The oscillation frequency of the source-oscillation clock RCLK is approximately 50 MHz e.g. at a power-source voltage of 5V, which is considerably great as compared to the oscillation frequency (approximately 1 MHz) of an RC oscillator incorporated in the conventional microcomputer, e.g. a second RC oscillator (53) hereinafter referred. The first RC oscillator (10) is configured to start oscillation according to a start signal ST and be shiftable in oscillation frequency according to a control signal FC.

Figure 2:
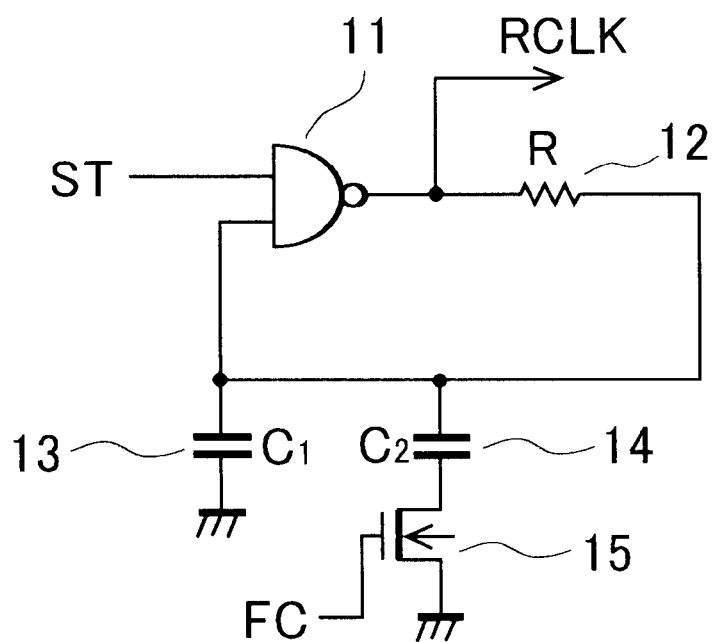
FIG. 2 shows a circuit diagram of an RC oscillator according to an embodiment of the invention.

Referring to FIG. 2, the output of a NAND circuit (11) is fed back to one input terminal of the NAND circuit (11) through a resistance (12) having a resistance value R, thus forming an oscillation loop. To this oscillation loop is coupled a capacitor (13) having a capacitance value C1.

Meanwhile, a capacitor (14) having a capacitance value C2 and a MOS transistor (15) under control of the control signal FC are connected in series. When the control signal FC is high in level, the MOS transistor (15) turns to an ON state to couple the capacitor (14), together with the capacitor (13), to the oscillation loop. When the control signal FC is low in level, the MOS transistor (15) turns to an OFF state to isolate the capacitor (14) from the oscillation loop.

Herein, C2 is considerably smaller than C1 (C2<<C1). Consequently, by properly setting the ratio of C2 and C1, the frequency of source oscillation clock RCLK is made shiftable, e.g. by approximately 1%, according to the control signal FC. This deviates the peak in the radiation noise due to the source oscillation clock frequency thereby making possible to eliminate the noise affection onto the LSI. Particularly, where the frequency-variable RC oscillating circuit (100) is incorporated in a microcomputer for audio-device control, it is effective to implement such frequency shifting.

The source oscillation clock RCLK from the first RC oscillator (10) is supplied to a counter (20). The counter (20) is an n-bit binary counter to count the number of source oscillation clocks RCLK.

A frequency setting register (30) is configured with an n-bit latch circuit to latch the bit data to be compared with a count value of the counter (20), i.e. the number of source oscillation clocks RCLK in accordance with a desired oscillation frequency.

A comparator (40) compares a count value of the counter (20) with a set value of the frequency setting register (30), to output high level when the count value of the counter (20) becomes equal to or greater than the set value of the frequency setting register (30). The counter (20) is reset according to a high-level output of the comparator (40).

The output of the comparator (40) is supplied to a Toggling Flip Flop (50) (hereinafter abbreviated as TFF). In this manner, a clock is toggle-outputted from the TFF (50) each time the counted, by counter (20), source oscillation clocks RCLK reaches the set value of the frequency setting register (30).

The output clock frequency of the frequency-variable RC oscillating circuit (100) configured as above can be set based on an oscillation-period step in the source oscillation clock. Accordingly, the oscillation frequency can be finely adjusted as the source oscillation clock is raised higher in oscillation frequency.

Figure 3:
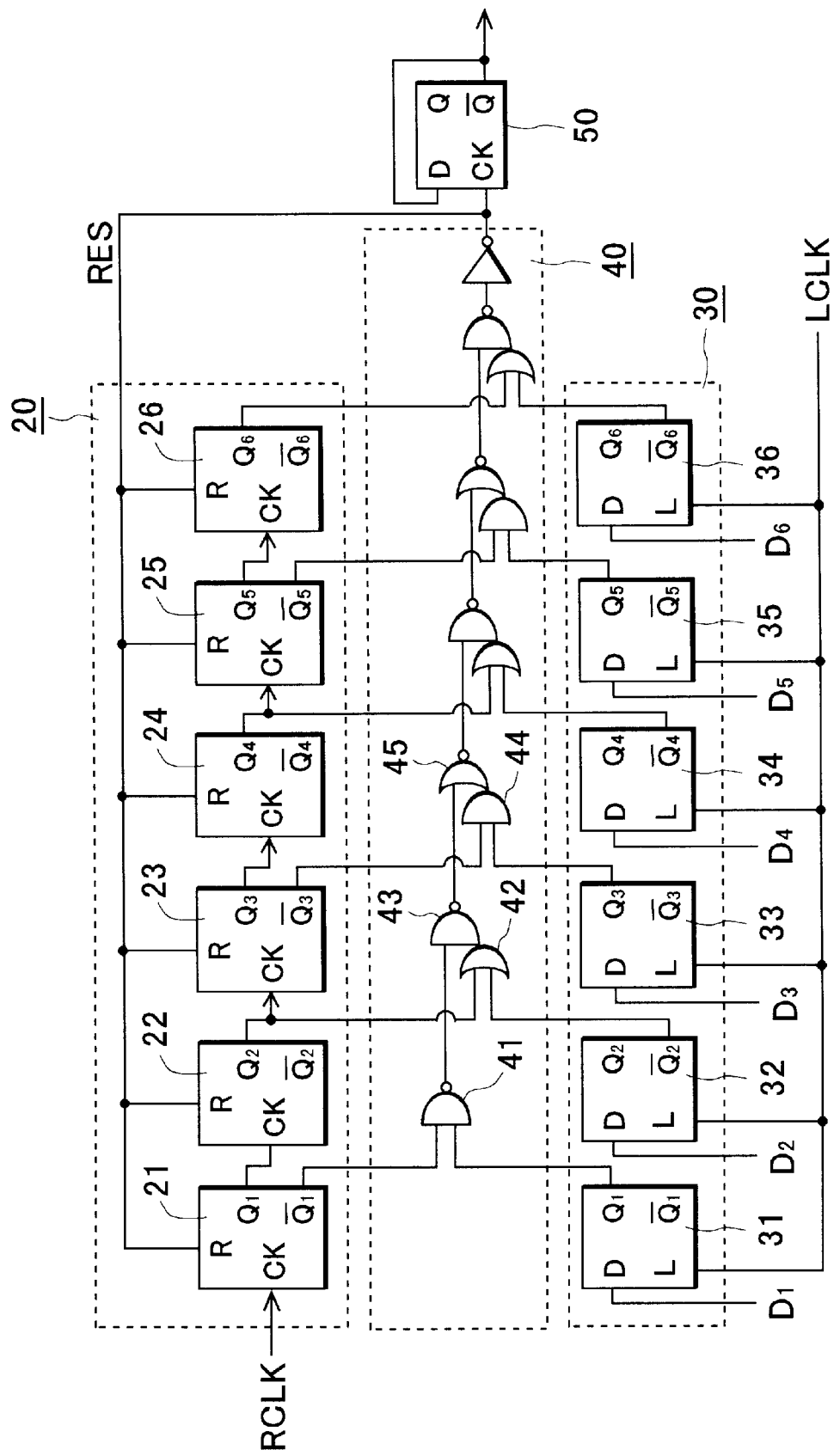
FIG. 3 shows a diagram showing a concrete circuit configuration of a counter, frequency setting register and comparator according to an embodiment of the invention.

FIG. 3 is a diagram showing a concrete circuit configuration example of the counter (20), frequency setting register (30) and comparator (40). Although the counter (20) and the frequency setting register are a 6-bit configuration, the number of bits can be increased and decreased without limitation to this configuration. The counter (20) is configured by the connection having six TFFs (21, 22, 23, 24, 25, 26) each having a reset terminal.

Meanwhile, the frequency setting register (30) is configured with six latch circuits (31, 32, 33, 34, 35, 36). These latch circuits (31–36) are configured to be, respectively, set to six bit setting data D1–D6 from data terminals D in synchronous with a latch clock LCLCK.

The comparator (40) is configured with logic gates as follows. The inverted output $\overline{Q1}$ of TFF 21 and the output Q1 of latch circuit 31 are supplied to a NAND circuit 41. The output Q2 of TFF 22 and the inverted output $\overline{Q2}$ of latch circuit 32 are supplied to an OR circuit 42. The output of NAND circuit 41 and the output of OR circuit 42 are supplied to a NAND circuit 43.

The inverted output $\overline{Q3}$ of TFF 23 and the output Q3 of latch circuit 33 are supplied to an AND circuit 44. The output of NAND circuit 43 and the output of AND circuit 44 are supplied to a NOR circuit 45. Similar operation is repeated in the followings.

The output of comparator (40) is supplied to the reset terminals R of TFFs (21–26). In the above configuration, when the count value (Q1, Q2, Q3, Q4, Q5, Q6) of counter (20) becomes equal to or greater than a set value (D1, D2, D3, D4, D5, D6) of frequency setting register (30), the output of comparator (40) goes to high level. Thereupon, the counter (20) is reset. Accordingly, a clock is toggle-outputted from the TFF (50) each time the counted, by counter (20), source oscillation clock RCLK reaches the set value of the frequency setting register (30).

Referring again to FIG. 1, explanation is made on the microcomputer incorporating a frequency-variable RC oscillating circuit (100) configured above. The output clock from frequency-variable RC oscillating circuit (100) is supplied through a switch SW1 to a clock generator (51) where a system clock SCLK is created to operate the microcomputer.

Meanwhile, the clock from an external oscillator (52), such as a ceramic filter or quartz oscillator, is supplied to the clock generator (51) through a switch SW2.

Meanwhile, the clock from second RC oscillator (53) is supplied to the clock generator (51) through a switch SW3. The second RC oscillator (53) has a circuit configuration similar to that of the first RC oscillator (10). However, the RC time constant is set great to provide an oscillation frequency, e.g. of 1 MHz, which is lower in setting than the oscillation frequency of first RC oscillator (10).

Explanation is now made on a method for setting the frequency setting register (30) in the microcomputer. Immediately after powering on and resetting the microcomputer, the second RC oscillator (53) starts oscillation. It is assumed that initial setting is made such that the switch SW3 is closed and the switches SW1, SW2 are open in the initial state of microcomputer. Consequently, the output clock of second RC oscillator (53) is supplied to the clock generator (51) to generate a system clock SCLK. Due to this, the microcomputer in the initial state operates on the clock generated by the second RC oscillator (53).

Accordingly, the frequency setting register (30) is automatically initialized in value to a frequency close to the clock frequency generated by the second RC oscillator (53). For example, the CPU (57) executes the following operation on the basis of a program command read out of a ROM (56). The CPU (57) writes the setting value data corresponding to an oscillation frequency, for example, of approximately 1 MHz to the frequency setting register (30) through a bus (54). Then, according to a start signal ST, the first RC oscillator (10) starts oscillating operation. This compares the count value of counter (20) with the setting value of the frequency setting register (30). Depending on a result of this comparison, a clock having an oscillation frequency of approximately 1 MHz is outputted from the frequency setting register (30).

Consequently, when the switch SW1 is closed to open SW3, an output clock of the frequency-variable RC oscillating circuit (100) is supplied to the clock generator (51) so that the microcomputer becomes operating on the basis of the output clock of the frequency-variable RC oscillating circuit (100). This makes programmable the oscillation frequency of the frequency-variable RC oscillating circuit (100).

In the case that the output-clock frequency has deviated from a target frequency or varied from a desired frequency (e.g. 1 MHz) due to change in power voltage or temperature, the user is allowed to freely set an algorithm for approximation to a target frequency. For example, it is possible in a software fashion to change the setting value on the frequency setting register (30) such that the oscillation frequency is approximated to 1 MHz.

Meanwhile, where requiring a system clock having a more exact frequency, by closing the switch SW2 and opening the switches SW1 and SW3, a clock from the external oscillator (52) can be supplied to the clock generator (51) thereby making a system clock SCLK. In this manner, the microcomputer thus configured has a merit to broaden the width in selecting a clock source for a system clock SCLK in accordance with application.

Incidentally, the frequency-variable RC oscillating circuit (100) of the invention can be broadly applied to the LSIs requiring a clock source without being limited to a microcomputer.

According to the frequency-variable RC oscillating circuit of the invention, because the frequency can be varied in accordance with setting on the frequency setting register, the frequency variation due to variation in manufacture can be compensated thus making possible to provide a correct operation clock.

Meanwhile, the microcomputer of the invention, incorporating the frequency-variable RC oscillating circuit, can utilize the RC oscillating circuit as a clock supply source in executing the main process. This facilitates software development and reduces the circuit parts for oscillation and hence the cost.

What is claimed is:

1. A frequency-variable RC oscillator comprising:

an RC oscillator including a resistance and a capacitor;

a counter for counting the number of source oscillation clocks from the RC oscillator;

a frequency setting register for setting the number of source of oscillation clocks corresponding to a desired oscillation frequency; and a comparator for comparing between a count value of said counter and a set value of said frequency setting register;

whereby a clock is outputted depending upon a result of comparison by said comparator.

2. A frequency-variable RC oscillator according to claim 1, wherein said counter is reset by an output of said comparator each time the count value of said counter becomes equal to or greater than a set value of said frequency setting register.

3. A frequency-variable RC oscillator according to claim 1, further comprising a toggling flip-flop circuit for outputting a toggled output depending upon an output of said comparator.

4. A frequency-variable RC oscillator according to claim 1, wherein said RC oscillator comprises a first capacitor coupled to an oscillation loop, a second capacitor having a capacitance value smaller as compared to a capacitance value of said first capacitor, and a switch device for coupling said second capacitor to the oscillation loop according to a control signal.

5. A microcomputer creating a system clock for self-operation on the basis of a clock from an RC oscillator, the microcomputer comprising:

a counter for counting the number of source oscillation clocks from said RC oscillator;

a frequency setting register for setting the number of source oscillation clocks in accordance with a desired oscillation frequency;

a comparator for comparing between a count value of said counter and a set value of said frequency setting register; and a clock generator for generating a system clock on the basis of a clock outputted depending on a result of comparison by said comparator.

6. A microcomputer according to claim 5, wherein said counter is reset by an output of said comparator each time the count value of said counter becomes equal to or greater than a set value of said frequency setting register.

7. A microcomputer according to claim 5, further comprising a toggling flip-flop circuit for providing a toggled output depending upon an output of said comparator.

8. A microcomputer according to claim 5, wherein said RC oscillator comprises a first capacitor coupled to an oscillation loop, a second capacitor having a capacitance value smaller as compared to a capacitance value of said first capacitor, and a switch device for coupling said second capacitor to the oscillation loop according to a control signal.

9. A microcomputer according to claim 5, further comprising a second oscillator having an oscillation frequency smaller as compared to an oscillation frequency of said RC oscillator and supplying an output clock to said clock generator; and an input terminal to which various kinds of data are to be inputted;

whereby said microcomputer is made operable on the basis of a system clock from said clock generator and said frequency setting register is set in value depending upon a reference clock supplied to said input terminal.

10. A microcomputer according to claim 9, further comprising a switch device for supplying selectively an output of said first oscillator and an output of said second oscillator.

11. A frequency-variable RC oscillator according to claim 1, wherein the counter is reset by an output of the comparator.

12. A microcomputer according to claim 5, wherein the counter is reset by an output of the comparator.

* * * * *